US011444444B2

(12) United States Patent
Busekrus et al.

(10) Patent No.: US 11,444,444 B2
(45) Date of Patent: Sep. 13, 2022

(54) ARC DETECTION ANTENNA IN ELECTRIC METER SYSTEMS

(71) Applicant: Landis+Gyr Innovations, Inc., Alpharetta, GA (US)

(72) Inventors: Doug Busekrus, Lafayette, IN (US); Matthew Kraus, Jamestown, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 366 days.

(21) Appl. No.: 16/776,833

(22) Filed: Jan. 30, 2020

(65) Prior Publication Data
US 2021/0242675 A1    Aug. 5, 2021

(51) Int. Cl.
*H02H 1/00* (2006.01)
*G01R 31/69* (2020.01)
*G01R 22/06* (2006.01)
*H01H 71/12* (2006.01)
*H01Q 1/50* (2006.01)

(52) U.S. Cl.
CPC ......... *H02H 1/0015* (2013.01); *G01R 22/068* (2013.01); *G01R 31/69* (2020.01); *H01H 71/125* (2013.01); *H01Q 1/50* (2013.01)

(58) Field of Classification Search
CPC .... H02H 1/0015; G01R 22/068; G01R 31/69; G01R 19/2513; G01R 31/086; G01R 31/1263; G01R 31/52; G01R 15/183; H01H 71/125; H01Q 1/50
USPC ........................................ 324/500, 509, 512
See application file for complete search history.

(56) References Cited

U.S. PATENT DOCUMENTS

| 2,601,250 | A | * | 6/1952 | William | B66B 13/26 318/446 |
| 2,652,521 | A | * | 9/1953 | Westphal | H05K 9/002 336/84 R |
| 5,185,684 | A | | 2/1993 | Beihoff et al. | |
| 5,434,509 | A | | 7/1995 | Blades | |

(Continued)

FOREIGN PATENT DOCUMENTS

CN    204116416 U   *   1/2015

OTHER PUBLICATIONS

International Patent Application No. PCT/US2021/015092, International Search Report and Written Opinion, dated May 12, 2021, 10 pages.

*Primary Examiner* — Giovanni Astacio-Oquendo
(74) *Attorney, Agent, or Firm* — Kilpatrick Townsend & Stockton LLP

(57) ABSTRACT

An electric meter in a utility box is capable of detecting arcing conditions between meter blades and a meter socket in the utility box at a premises. The electric meter includes a current-transformer structure forming an enclosed space. An arc detection antenna can be placed in the enclosed space along with the current transformer. The current-transformer structure is placed on a baseplate of the electric meter near the blades connected to the meter socket. Leads of the arc detection antenna are electrically connected to an arc detection circuit configured to detect arcing conditions based on the signal received from the arc detection antenna. If it is determined that the arcing condition is present, the electric meter may be activated to interrupt the connection between the power source and the premises.

16 Claims, 6 Drawing Sheets

(56) References Cited

U.S. PATENT DOCUMENTS

| | | | |
|---|---|---|---|
| 2012/0249336 A1* | 10/2012 | Moell | G01R 15/18 |
| | | | 324/555 |
| 2013/0243425 A1* | 9/2013 | Franklin | H04B 10/116 |
| | | | 398/38 |
| 2015/0091667 A1* | 4/2015 | Seneviratne | H03F 1/565 |
| | | | 333/35 |
| 2015/0309104 A1 | 10/2015 | Moll et al. | |
| 2016/0010442 A1* | 1/2016 | Kearl | E21B 43/2401 |
| | | | 166/305.1 |
| 2016/0306002 A1 | 10/2016 | Gass et al. | |
| 2018/0246150 A1* | 8/2018 | Cook | G01R 15/16 |
| 2019/0120885 A1* | 4/2019 | Kraus | G01R 22/066 |
| 2019/0227105 A1 | 7/2019 | Minich et al. | |

\* cited by examiner

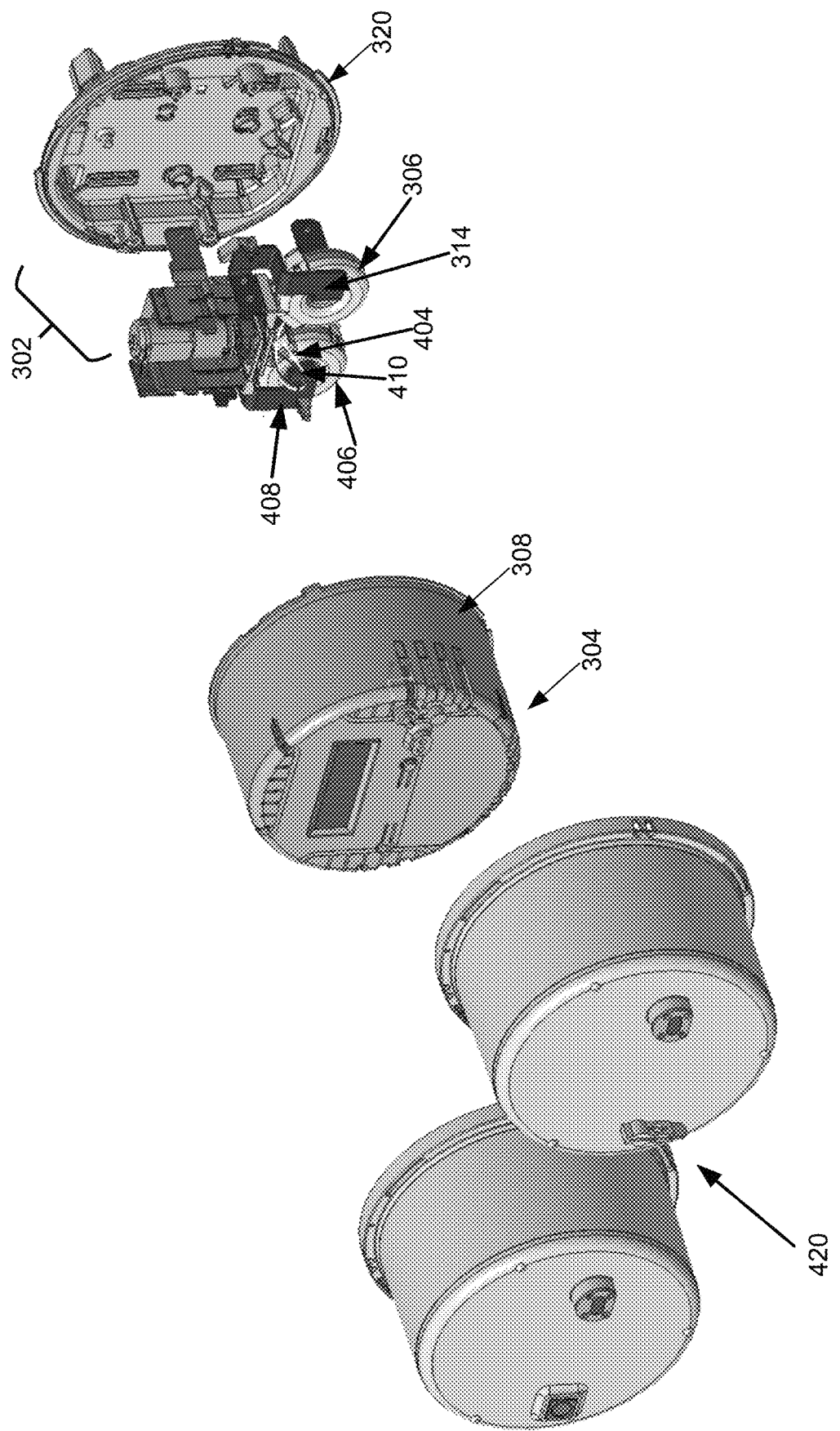

ARC DETECTION ANTENNA IN ELECTRIC METER SYSTEMS

FIELD OF THE INVENTION

This disclosure relates generally to the field of safety in electrical utility systems, and more specifically relates to an arc detection antenna installed in an electric meter for detecting electrical arcs between electrical metering components included in a utility box at a premises.

BACKGROUND

Many residential and commercial premises include electric meters to allow utility companies to monitor the consumption of electricity within the premises. To do so, an electric meter is electrically connected to a meter socket, which is usually located in a utility box positioned on an outside wall of the premises. The electric meter may include meter blades, which are received in the meter socket and held in place by a tension force applied to the blades by the meter socket.

In some instances, the installation of a new meter to replace an old meter may create a phenomenon known as "arcing" where an electrical arc is formed in a gap between a meter blade and a corresponding socket jaw of the meter socket as the meter is installed. Arcing may also occur randomly, subsequent to the installation period. For example, if the tension force of the socket is lessened, then gaps may occur between the blades and the socket. The gaps provide an environment conducive to arcing. The presence of arcing in an electric metering system may cause high heat, and in some instances, a fire that may cause significant damages to the components of the electric meter systems, the premises, and may also injure humans, such as workers assisting with a meter replacement. Therefore, it is important to detect arcing conditions before any damage or endangerment occurs.

To detect the arcing conditions, an electric meter can be configured with an arc detection component. However, because of the high voltage condition near the location where the arcing occurs, the arc detection component is typically placed at a location within the meter that is away from the meter blades and the meter sockets. The large distance between the arc detection component and the location of the arcing can lead to inaccurate detection of the arcing.

SUMMARY

Aspects and examples are disclosed for an electric meter capable of detecting electrical arcing between the electrical meter and a meter socket in a utility box that is connected to a power line. In an example implementation, the electric meter includes a baseplate assembly and a housing assembly. The baseplate assembly includes an electrical conductor connecting two meter blades. Each of the meter blades is configured to be positioned in a corresponding socket jaw of the meter socket to electrically connect the electric meter to the meter socket. The baseplate assembly further includes a current-transformer structure including a current transformer holder and a current transformer cover forming an enclosed space. The current-transformer structure also includes a current transformer positioned in the enclosed space and inductively coupled to the electrical conductor. The current-transformer structure further includes an arc detection antenna placed in the enclosed space and adjacent to the current transformer. The leads of the arc detection antenna extend outside the current-transformer structure. The housing assembly is configured to be coupled to the meter baseplate assembly and includes a circuit board hosting an arc detection circuit configured to detect electrical arcing. The leads of the arc detection antenna are electrically connected to the arc detection circuit.

In another example, a current-transformer structure includes a current transformer holder and a current transformer cover forming an enclosed space when connected to the current transformer holder. The current-transformer structure also includes a current transformer positioned in the enclosed space. The current-transformer structure further includes an arc detection antenna placed in the enclosed space and adjacent to the current transformer. The leads of the arc detection antenna extend outside the current-transformer structure.

These illustrative embodiments are mentioned not to limit or define the disclosure, but to provide examples to aid understanding thereof. Additional embodiments are discussed in the Detailed Description, and further description is provided there.

DESCRIPTION OF THE DRAWINGS

Features, embodiments, and advantages of the present disclosure are better understood when the following Detailed Description is read with reference to the accompanying drawings, where:

FIG. 4 shows a baseplate assembly of the electric meter shown in FIG. 3, according to some aspects;

DETAILED DESCRIPTION

Figure 1B:
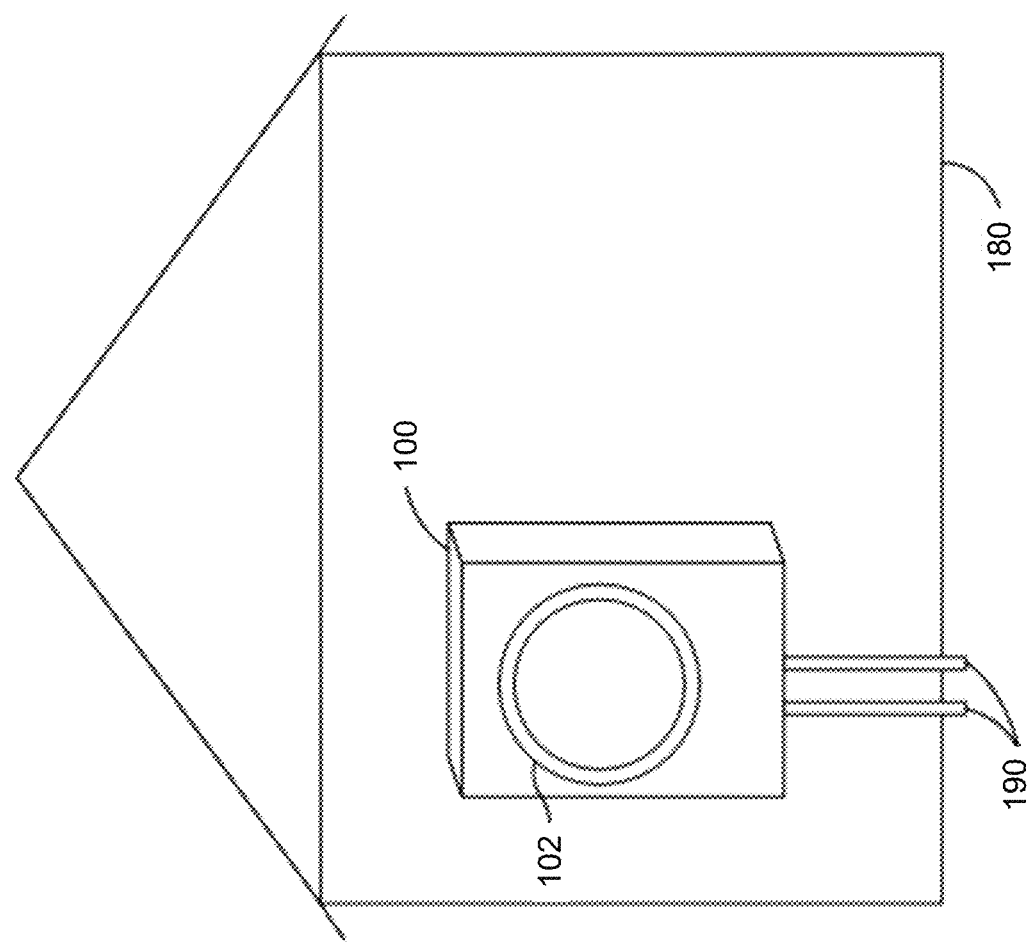
FIGS. 1A and 1B are block diagrams depicting examples of an electrical meter, a utility box, and a meter socket, according to some aspects.

Certain aspects and examples of the present disclosure relate to an electric meter for detecting arcing conditions between the electric meter and a meter socket in the utility box at premises. In some aspects, an electric meter may include a baseplate assembly containing a baseplate and at least an electrical conductor connecting two meter blades. Each of the meter blades extends from the baseplate and is configured to engage a corresponding socket jaw of the meter socket to electrically connect the electric meter to the meter socket that is connected to a power line. The baseplate assembly further includes a current transformer inductively coupled to the electrical conductor to provide a current to a metrology circuit of the meter so that the meter can monitor the electrical current levels in the power line. The current transformer is placed inside an enclosed space of a current-transformer structure formed by a current transformer holder and a current transformer cover.

To detect the arcing conditions, the current-transformer structure further includes an arc detection antenna, such as a loop antenna. The arc detection antenna can be placed inside the enclosed space of the current-transformer structure and adjacent to the current transformer. Leads of the arc detection antenna and leads of the current transformer extend outside the current-transformer structure and are isolated from each other.

The electric meter may further include a housing assembly configured to be coupled to the baseplate assembly to form a complete meter assembly. The housing assembly includes at least one circuit board hosting an arc detection circuit configured to detect the electrical arcing conditions based on the signal generated by the arc detection antenna. The leads of the arc detection antenna are electrically connected to the arc detection circuit. The same circuit board or a different circuit board in the housing assembly may host a measurement circuit configured to measure the power consumed by the premises. For example, the leads of the current transformer can be electrically connected to the measurement circuit for measurement purposes.

In certain configurations of the electric meter, the current-transformer structure is placed next to the baseplate of the meter and the circuit board hosting the arc detection circuit is placed at one end of the housing assembly that is further away from the baseplate. As a result, the arc detection antenna is in close proximity to the place where the arcing occurs (i.e., the blades) and thus can detect the arcing with higher accuracy. In addition, because the arc detection antenna is placed inside the current-transformer structure which is properly insulated, the arc detection antenna is not exposed to the high voltage condition near the blades and thus can function properly. Compared with the prior approaches where the arc detection antenna is placed on the circuit board to avoid exposure to the high voltage condition, the electric meter disclosed herein can provide more accurate arc detection. Furthermore, the current-transformer structure generally provides a larger space for placing the arc detection antenna than the circuit board. As a result, the detection sensitivity of the arc detection antenna can be increased and/or the number of turns of the arc detection antenna can be reduced. This leads to more flexibility in the design or performance of the arc detection antenna than the prior approach.

Figure 1A:
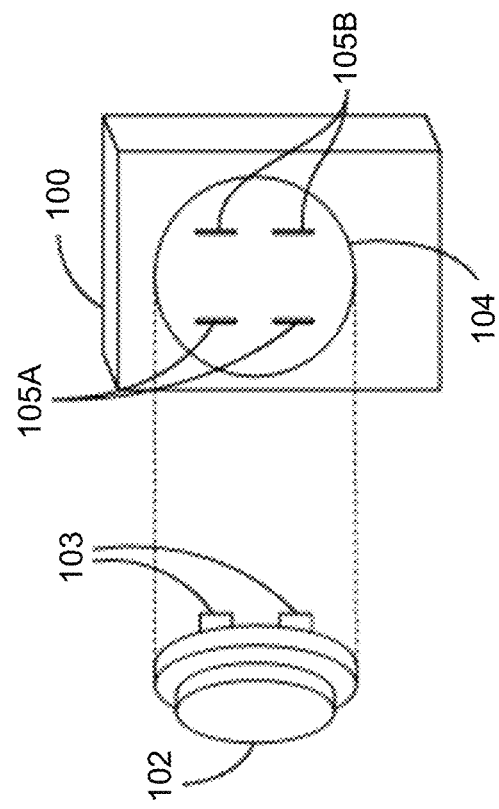

FIGS. 1A and 1B show block diagrams of an electric meter, a utility box, and a meter socket. FIG. 1A is a diagram depicting an electric meter 102 that includes one or more blades, such as blades 103. FIG. 1A also shows a utility box 100 including a meter socket 104. The meter socket 104 includes receptacles 105, also referred to as "socket jaws" 105, into which the blades 103 may be positioned or engaged. The socket jaws 105 include utility-side socket jaws 105A and premises-side socket jaws 105B. The electric meter 102 may be fitted into the meter socket 104, as indicated by the dotted lines in FIG. 1A, such that the blades 103 are positioned in the socket jaws 105. Positioning the blades 103 within the socket jaws 105 electrically connects the electric meter 102 to the meter socket 104. The meter socket 104 may include springs or other means to provide a tension force on the blades to maintain the position of the blades within the socket jaws of the meter socket 104. The meter socket 104 and blades may each include one or more surfaces made out of a conductive material to allow electricity to flow between the meter socket 104 and the blades.

The blades 103 and the socket jaws 105 may be configured such that electrical signals are transmitted between a utility side of the meter socket 104 and the electric meter 102, and between the electric meter 102 and a premises side of the meter socket 104. For example, electrical signals received from the utility company may be transmitted to the electric meter 102 via the utility-side socket jaws 105A and blades (not visible in FIG. 1A) on the utility side of the electric meter 102. In addition, the electrical signals may be transmitted to the premises via the blades 103 on the premises side of the electric meter 102 and the premises-side socket jaws 105B. The electric meter 102 may perform operations as the electrical signals are transmitted between the utility side and the premises side, including generating voltage sense or current sense signals, determining measurements, and other operations. In addition, the electric meter 102 may also be configured to detect arcing conditions near the blades 103 and the socket jaws 105.

FIG. 1B is a diagram depicting an example configuration of the utility box 100 with the electric meter 102 installed. The electric meter 102 may be installed by being positioned in the meter socket 104 (not visible in FIG. 1B). The utility box 100 may be positioned proximate to a premises 180 which receives power from a utility company. Power lines 190 may be electrically connected to the utility box 100 to supply power to the premises 180 from the utility company. The power from the power lines 190 may be routed through the meter socket 104 included in the utility box 100, such as by being transmitted between utility-side and premises-side meter socket jaws via the installed electric meter 102. The installed electric meter 102 may measure various aspects of the power supplied via the power lines 190, such as to determine an overall power usage by the premises 180.

In additional aspects, the installed electric meter 102 may also detect the arcing conditions between the electrical meter 102 and the meter socket 104 in the utility box 100. The detected arcing conditions can be utilized to determine whether to disconnect the electric meter 102 from the meter socket 104, thereby disconnecting the electric meter 102 from the power line 190, or to instruct the electric meter 102 to open one or more disconnect switches in the electric meter 102.

Figure 2:
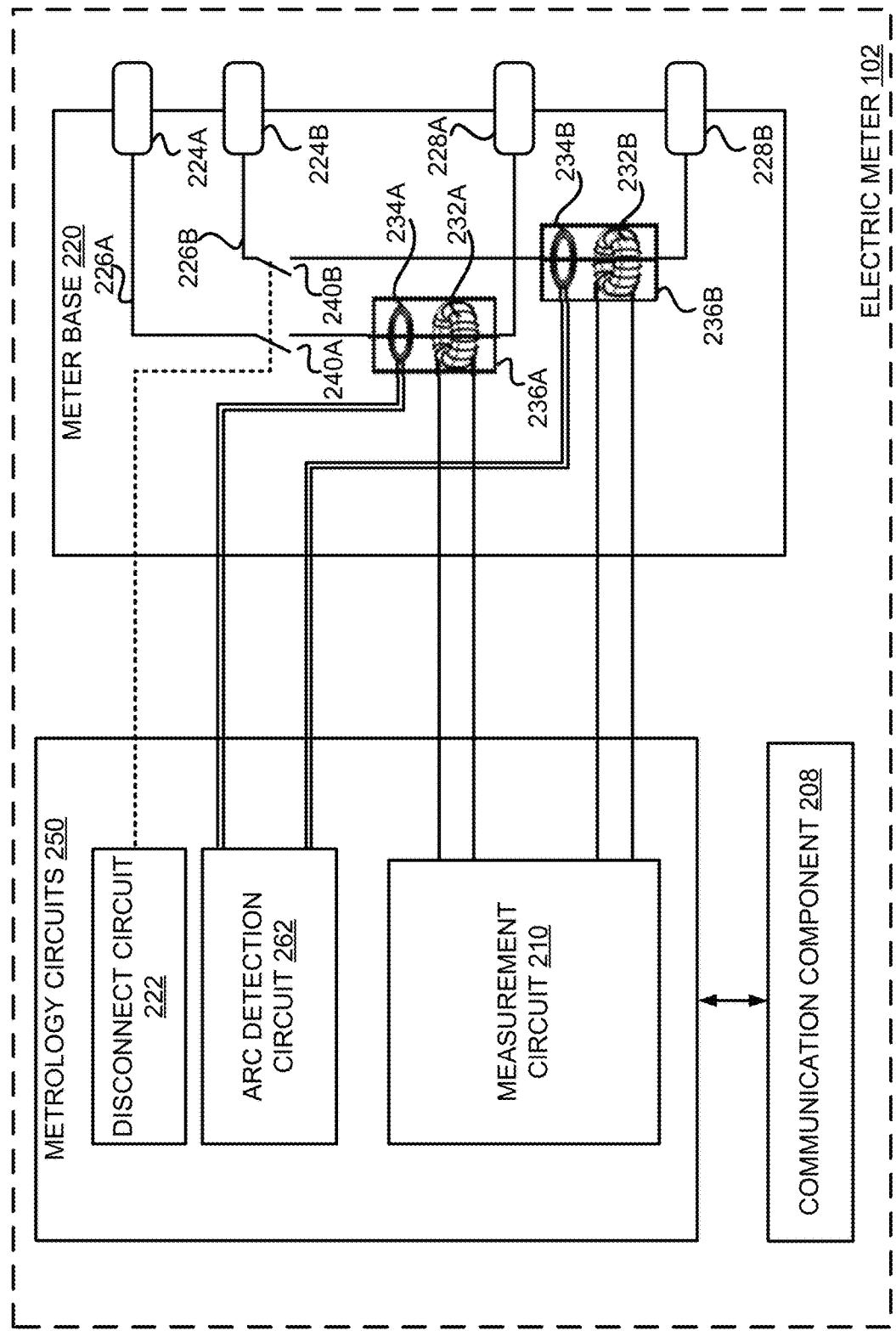
FIG. 2 is a block diagram depicting a simplified example of components contained in an electric meter capable of detecting arcing conditions present in a utility box, according to some aspects.

FIG. 2 is a block diagram depicting a simplified example of components contained in an electric meter 102 capable of detecting an electrical arc between the electric meter 102 and the meter socket 104, according to some aspects of the present disclosure. The electric meter 102 shown in FIG. 2 includes a meter base 220, a metrology circuit 250, and a communication component 208 that are supported by and at least partially contained within a housing of the electric meter 102.

The meter base 220 includes two pairs of terminals 224A/228A and 224B/128B (such as the meter blades 103 shown in FIG. 1) that are electrically connected together by electrical conductors 226A and 226B, respectively. Each of the terminals 224A, 224B, 228A, and 228B extends from the housing of the electric meter 102 to engage a meter socket (e.g., the meter socket 104 shown in FIG. 1) that is connected to a power line (e.g., the power line 192 shown in FIG. 1). Each of the terminal pairs 224A/228A and 124B/128B is configured to connect in-line with a conductor in the power line where all of the electrical signals that pass through the power line from an energy source to a load passes through the terminal pairs 224A/228A and 224B/228B to the load. The terminal pairs 224A/228A and 224B/228B and the electrical conductors 226A and 226B effectively become part of the power line connected between the generation source and the load when the electric meter 102 is connected to the meter socket.

The meter base 220 further includes current transformers 232A and 232B that are inductively coupled to the electrical conductors 226A and 226B, respectively. The current transformers 232A and 232B are electrically connected to a measurement circuit 210 of the metrology circuits 250. The alternating current waveforms in the electrical conductors 226A and 226B induce a current in the current transformers 232A and 232B, respectively. The current can be utilized to monitor electrical current levels in the power line such as by a current sense circuit in the measurement circuit 210. The measurement circuit 210 may include other circuits for measuring purposes, such as a voltage sense circuit for measuring the voltage of the power line. The voltage sense circuit may be connected to the terminals 224A, 228A, 124B, and 128B to measure the voltage. Voltage sense signals and current sense signals generated by the voltage sense circuit and the current sense circuit, respectively, may be routed to a processing device (not shown in FIG. 2) of the metrology circuits 250 to, for example, determine the power consumed by the premises.

To detect the arcing conditions, the meter base 220 also includes arc detection antennas 234A and 234B placed adjacent to the current transformers 232A and 232B, respectively. The arc detection antennas 234A and 234B are electrically connected to an arc detection circuit 262 of the metrology circuits 250. The arc detection antennas 234A and 234B provide detected signals to the arc detection circuit 262 for detecting arcing conditions between the terminals 224A, 224B, 228A, and 228B and their respective socket jaws in the meter socket. For instance, the arc detection circuit 262 can analyze the signals received from an arc detection antenna by filtering the received signals to focus on the signal in a certain frequency band to detect the arcing conditions. The current transformer 232A (or 232B) and the arc detection antenna 234A (or 234B) are placed in an enclosed structure referred to herein as a current transformer structure 236A (or 236B).

The electric meter 102 may be communicatively coupled to a remote device (not shown in FIG. 2) through a communication component 208. In some aspects, the communication component 208 may include one or more communication devices, such as a communication antenna and a radio, to send and receive message signals through a network between the electric meter 102 and the remote device. For example, the electric meter 102 may send a message containing the measured power consumption or other data to the remote device. The remote device may be communicatively coupled to multiple meters and may communicate the message across a network to a central system, such as a central system associated with an operator of the power utility. In some aspects, the communication component 108 may also transmit a message indicating an arcing condition in the utility box 100. The central system may process the message and, in response, transmit a signal instructing the electric meter 102 to disconnect the power to the premises when arcing occurs.

The electric meter 102 can disconnect the power to the premises by opening disconnect switches 240A and/or 240B as shown in FIG. 2. Each of the disconnect switches 240A and 240B moves between a closed position and an opened position. In the closed position the disconnect switches 240A and 240B establish an electrical connection between the terminal pairs 224A/228A and 224B/228B, respectively. In the opened position, the disconnect switches 240A and 240B disconnect the terminal pairs 224A/228A and 224B/228B, respectively. The disconnect switches 240A and 240B move between the closed and opened positions based on control signals from the metrology circuits 250. For example, the metrology circuits 250 can include a disconnect circuit 222 which can include an actuation device or other means to control the disconnect switches 240A and 240B to move between the closed position and the opened position.

Figure 3:
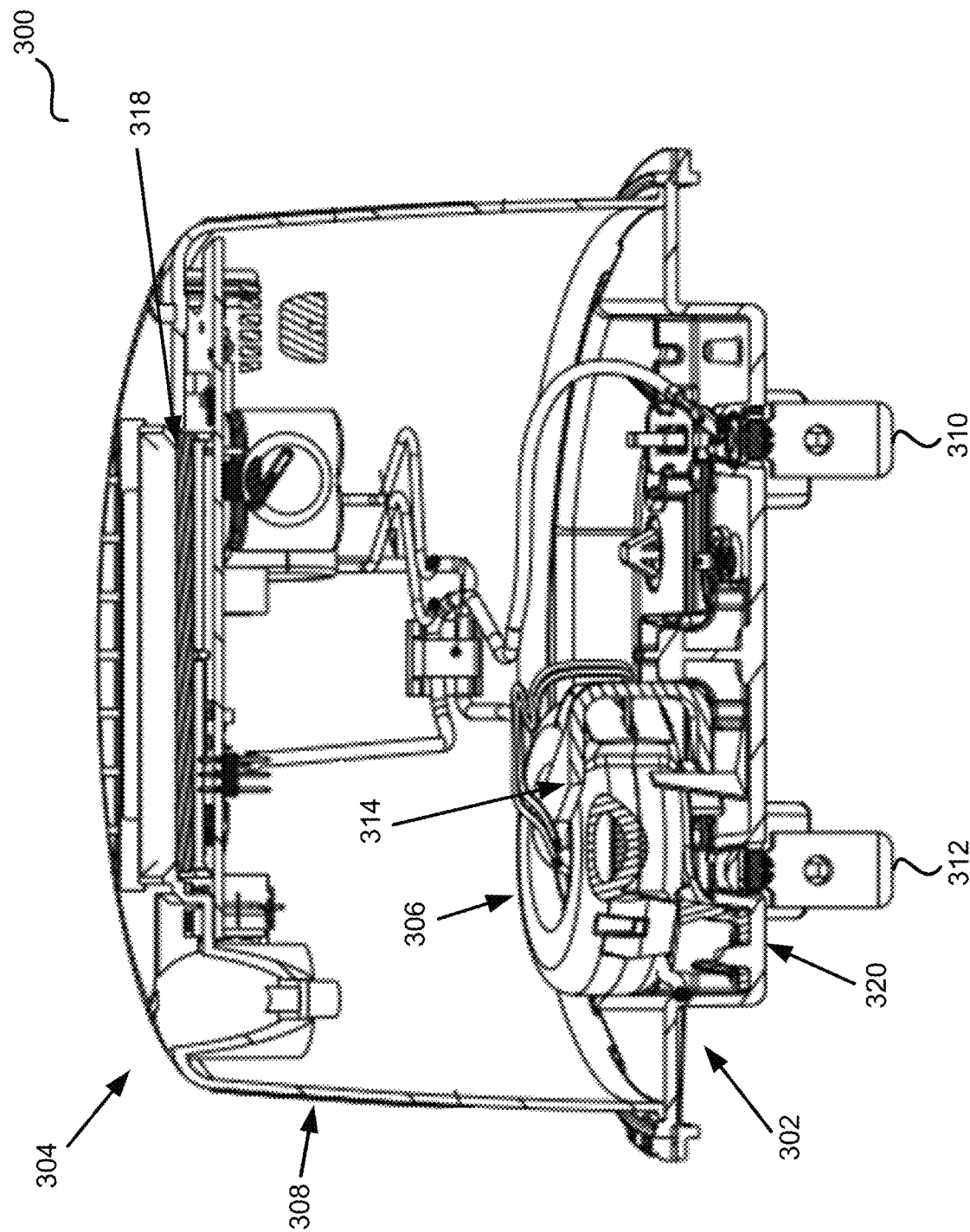
FIG. 3 shows a side view of an electric meter capable of detecting arcing conditions present in a utility box, according to some aspects.

FIG. 3 shows a cutaway side view of an electric meter 300 capable of detecting arcing conditions in a utility box according to some aspects of the present disclosure. As shown in FIG. 3, the electric meter 300 includes a baseplate assembly 302 and a housing assembly 304. In some examples, the various components of the meter base 220 discussed above with respect to FIG. 2 are installed in the baseplate assembly 302. For example, in FIG. 3, two meter blades 312 and 310 are connected by an electrical conductor 314 that passes through the ring formed by a current-transformer structure 306. The meter blades 312 and 310 extend from the outer side of a baseplate 320 of the baseplate assembly 302 so that they can be positioned into the socket jaws of the meter socket when being installed into the utility box.

In FIG. 3, the housing assembly 304 of the electric meter 300 includes a register cover 308, one or more printed circuit boards 318 and other components. When the register cover 308 is connected to the baseplate 320, it encloses the printed circuit boards 318. In some examples, the printed circuit boards 318 are installed on the front end of the housing assembly 304, i.e., the end that is away from the baseplate 320. In some examples, the measurement circuit 210 and the arc detection circuit 262 discussed above with respect to FIG. 2 are placed on one printed circuit board 318. In other examples, the measurement circuit 210 and the arc detection circuit 262 may be placed on separate printed circuit boards 318.

FIG. 4 shows an expanded view of the electric meter 300 including the baseplate assembly 302 and the housing assembly 304 and two alternative outer covers 420 of the electric meter 300. As shown in FIG. 4, the housing assembly 304 is used to hold the printed circuit boards 318 on the end that is away from the baseplate 320. The baseplate assembly 302 includes the current-transformer structure 306 and the current-transformer structure 406 (not visible in FIG. 3). The current-transformer structures 306 and 406 corresponds to the current transformer components 236A and 236B shown in FIG. 2, respectively. An electrical conductor 314 (or 408) passes through the ring formed by the current-transformer structure 306 (or 406) and connects two blades configured to be placed in the meter socket. The leads 404 (or 410) of the current transformer and the arc detection antenna extend outside the current-transformer structure 306 and can be connected to their respective circuits. As shown in FIGS. 3 and 4, the current-transformer structures 306 and 406 are installed on the inner side of the baseplate 320 and is in proximity to the baseplate 320.

As can be seen from FIG. 3, the current-transformer structure 306 is in proximity to the blades and thus to the place where the arcing occurs. Therefore, by placing the arc detection antenna inside the current-transformer structure 306, a more accurate arc detection can be achieved than placing the arc detection antenna in locations such as on or near the printed circuit board 318. In the meantime, the arc detection antenna can be shielded from the high voltage by leveraging the existing high-voltage protection of the current-transformer structure 306.

Figure 5B:
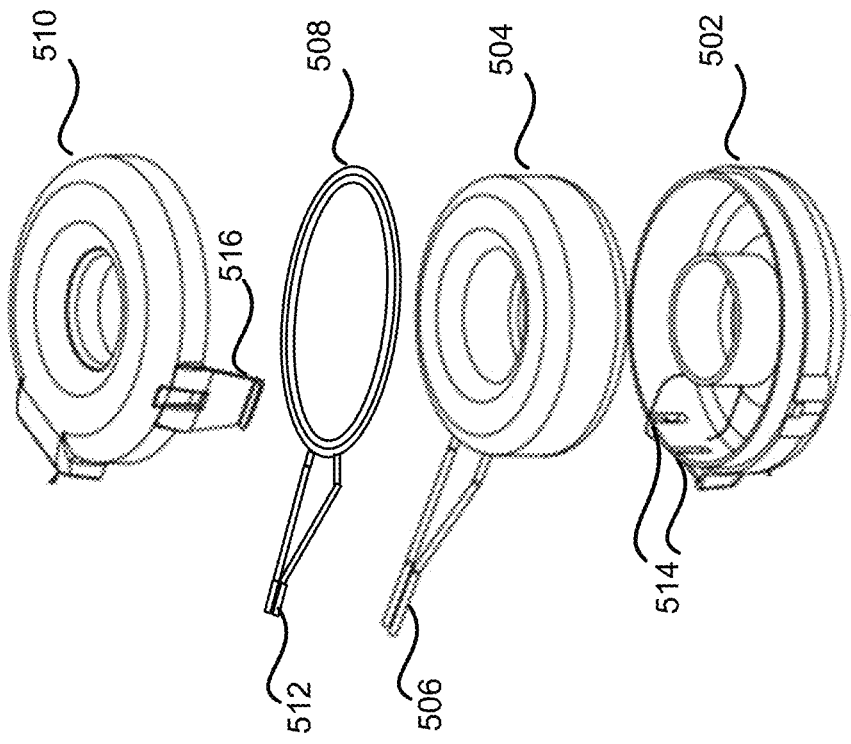
FIGS. 5A and 5B show an example of a current-transformer structure that can be installed in an electric meter for detecting an arcing condition in the utility box, according to some aspects.
Figure 5A:
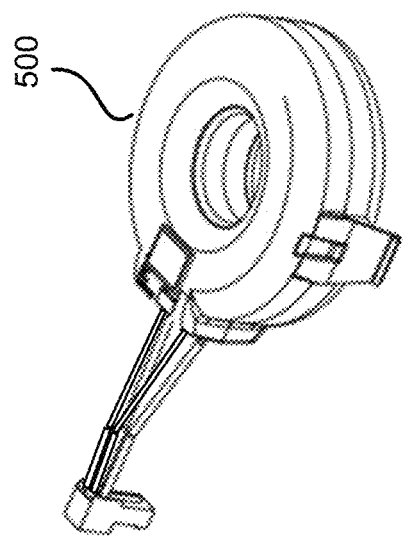

FIGS. 5A and 5B show an example of a current-transformer structure 500 that can be installed in an electric meter for detecting an arcing condition in the utility box, according to some aspects of the present disclosure. The current-transformer structure 500 can be used as the current-transformer structure 306 or 406 shown in FIG. 4. More specifically, FIG. 5A shows the assembled current-transformer structure 500 and FIG. 5B shows various components of the current-transformer structure 500.

As shown in FIGS. 5A and 5B, the current-transformer structure 500 includes a current transformer holder 502, a current transformer 504, an arc detection antenna 508, and a current transformer cover 510. The current transformer 504 corresponds to the current transformer 232A or 232B described above with respect to FIG. 2, and the arc detection antenna 508 corresponds to the arc detection antenna 234A or 234B in FIG. 2. The current transformer holder 502 can be connected to the current transformer cover 510 to form an enclosed donut-shaped space. The current transformer 504 and the arc detection antenna 508 are placed adjacent to each other in this enclosed donut-shaped space and between the current transformer holder 502 and the current transformer cover 510. The current transformer cover 510 can be connected or affixed to the transformer holder 502 through, for example, a latch 516 or other mechanical means to securely hold the current transformer 504 and the arc detection antenna 508 within the enclosed space.

In one configuration, the arc detection antenna 508 is placed between the current transformer 504 and the current transformer cover 510 as shown in FIG. 5B. In other configurations, the arc detection antenna 508 is placed between the current transformer 504 and the current transformer holder 502. If the arc detection antenna 508 is placed between the current transformer 504 and the current transformer cover 510, the arc detection antenna 508 can be affixed to the top surface of the current transformer 504 through, for example, glue (e.g., epoxy), tape, or other adhesive materials or mechanism means. Alternatively, or additionally, the arc detection antenna 508 may be affixed to the inner surface of the current transformer cover 510 using adhesive materials or mechanical affixing means. Similarly, if the arc detection antenna 508 is placed between the current transformer 504 and the current transformer holder 502, the arc detection antenna 508 can be affixed to the bottom surface of the current transformer or the inner surface of the current transformer holder 502 using proper affixing means. In some examples, the current transformer cover 510 or the current transformer holder 502 may include a custom housing portion to hold the arc detection antenna 508.

The leads 506 of the current transformer 504 and the leads 512 of the arc detection antenna 508 are isolated from each other and extend outside the enclosed space of the current-transformer structure 500. The leads 506 and the leads 512 can extend outside the current-transformer structure 500 through the same openings 514 as shown in FIG. 5B. In other configurations, they may pass through different openings.

Figure 6:
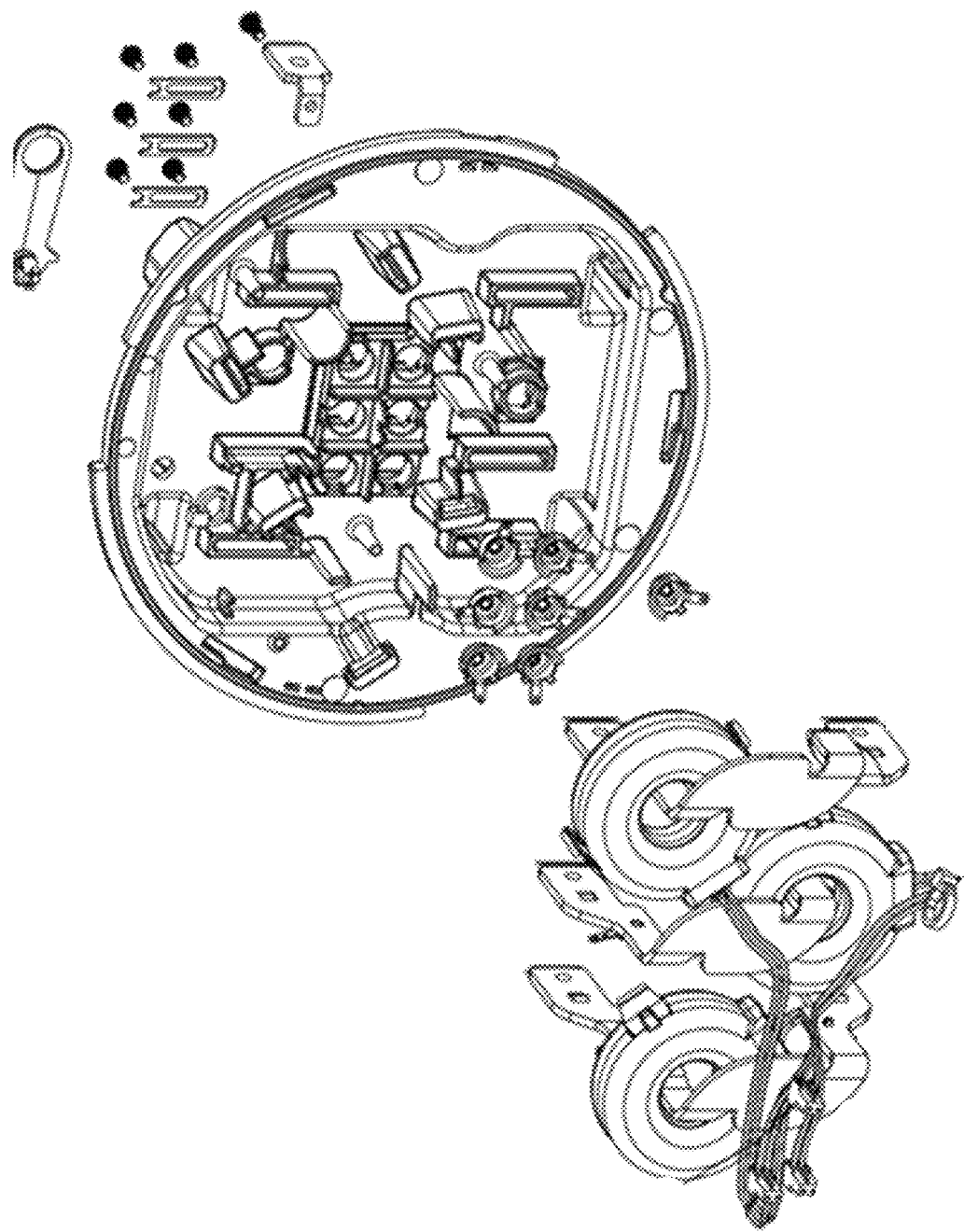
FIG. 6 shows an example of a baseplate assembly of a three-phase meter for detecting an arcing condition in a utility box, according to some aspects.

It should be understood that while the above figures depict a two-phase solution for the electric meter where two current-transformer structures are installed in an electric meter, the presented technique can be applied to other types of electric meters. For example, a single-phase electric meter can include the current-transformer structure presented herein to detect arc detection occurring on the single-phase line. Likewise, a three-phase electric meter can include three current-transformer structures presented herein to detect the arcing conditions in the respective phases. FIG. 6 shows an example of a baseplate assembly of a three-phase electric meter incorporating three current-transformer structures presented herein. It should be further understood that in some examples, only one of the current transformer structures in a multi-phase electric meter is equipped with an arc detection antenna to detect arcing condition. In these examples, the arc detection antenna can be placed in the current transformer structure on the centrally located phase such that the arc detection antenna is more equidistant to all of the blades.

While the present subject matter has been described in detail with respect to specific aspects, it will be appreciated that those skilled in the art, upon attaining an understanding of the foregoing may readily produce alterations to, variations of, and equivalents to such aspects. Accordingly, it should be understood that the present disclosure has been presented for purposes of example rather than limitation, and does not preclude inclusion of such modifications, variations, or additions to the present subject matter as would be readily apparent to one of ordinary skill in the art. Indeed, the methods and systems described herein may be embodied in a variety of other forms. Furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

What is claimed is:

1. An electric meter capable of detecting electrical arcing between the electric meter and a meter socket in a utility box that is connected to a power line, the electric meter comprising:
   a baseplate assembly comprising:
      an electrical conductor connecting two meter blades, each of the meter blades configured to be positioned in a corresponding socket jaw of the meter socket to electrically connect the electric meter to the meter socket; and
      a current-transformer structure comprising:
         a current transformer holder and a current transformer cover forming an enclosed space;
         a current transformer positioned in the enclosed space and inductively coupled to the electrical conductor; and
         an arc detection antenna placed in the enclosed space and adjacent to the current transformer, wherein leads of the arc detection antenna extend outside the current-transformer structure; and
   a housing assembly configured to be coupled to the baseplate assembly, the housing assembly comprising:
      circuit board hosting an arc detection circuit configured to detect electrical arcing, wherein the leads of the arc detection antenna are electrically connected to the arc detection circuit.

2. The electric meter of claim 1, wherein the arc detection antenna is affixed to the current transformer cover or the current transformer holder through an affixing means.

3. The electric meter of claim 1, wherein the arc detection antenna is affixed to the current transformer through an affixing means.

4. The electric meter of claim 1, wherein the arc detection antenna is positioned between the current transformer and the current transformer cover or between the current transformer and the current transformer holder.

5. The electric meter of claim 1, wherein the arc detection antenna is positioned at a location within the current-transformer structure and between the current transformer and a portion of the current transformer structure facing an inner side of a baseplate of the baseplate assembly.

6. The electric meter of claim 1, wherein the circuit board is positioned at one end of the housing assembly that is opposite to an end coupled to the baseplate assembly.

7. The electric meter of claim 1, wherein
the leads of the arc detection antenna are extended outside the current-transformer structure through one or more openings on the current transformer holder or the current transformer cover;
leads of the current transformer are extended outside the current-transformer structure through the same one or more openings; and
the leads of the arc detection antenna and the leads of the current transformer are isolated from each other.

8. The electric meter of claim 1, wherein the arc detection antenna is a loop antenna.

9. A current-transformer structure comprising:
a current transformer cover;
a current transformer holder which when connected to the current transformer cover forms an enclosed space;
a current transformer positioned within the enclosed space; and
an arc detection antenna placed within the enclosed space and adjacent to the current transformer, wherein leads of the arc detection antenna extend outside the current-transformer structure.

10. The current-transformer structure of claim 9, Therein the arc detection antenna is affixed to the current transformer cover or the current transformer holder.

11. The current-transformer structure of claim 9, wherein the arc detection antenna. is affixed to the current transformer.

12. The current-transformer structure of claim 9, wherein the arc detection antenna is positioned between the current transformer and the current transformer cover or between the current transformer holder and the current transformer.

13. The current-transformer structure of claim 9, further comprising an affixing means configured to affix the transformer cover to the transformer holder, wherein the affixing means comprises a latch.

14. The current-transformer structure of claim 9, wherein the arc detection antenna is positioned at a location within the current-transformer structure and between the current transformer and a portion of the current transformer structure facing an inner side of a baseplate.

15. The current-transformer structure of claim 9, wherein
the leads of the arc detection antenna are extended outside the current-transformer structure through one or more openings on the current transformer holder or the current transformer cover;
leads of the current, transformer are extended outside the current-transformer structure through the same one or more openings; and
the leads of the arc detection antenna and the leads of the current transformer are isolated from each other.

16. The current-transformer structure of claim 9, wherein the arc detection antenna is a loop antenna.

* * * * *